(12) United States Patent
Oka

(10) Patent No.: US 6,388,889 B1
(45) Date of Patent: May 14, 2002

(54) ELECTRICAL CONNECTOR HOUSING

(75) Inventor: Yoshito Oka, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 09/453,893

(22) Filed: Mar. 17, 2000

(51) Int. Cl.[7] .................................................. H01R 9/00
(52) U.S. Cl. ........................................ 361/775; 439/65
(58) Field of Search ............................ 439/65; 361/760, 361/764, 772, 773, 774, 775, 785, 611, 644, 648

(56) References Cited

U.S. PATENT DOCUMENTS

| | | | | |
|---|---|---|---|---|
| 3,591,834 A | * | 7/1971 | Kolias ........................ 361/791 |
| 4,120,041 A | * | 10/1978 | Hayakawa et al. ......... 364/712 |
| 4,255,004 A | * | 3/1981 | Kourimsky et al. ........... 439/65 |
| 4,472,764 A | * | 9/1984 | Richard et al. ............. 361/407 |
| 4,774,634 A | * | 9/1988 | Tate et al. ................... 361/400 |
| 5,339,217 A | | 8/1994 | Cohen et al. |
| 5,355,282 A | * | 10/1994 | Yokemura et al. .......... 361/760 |
| 5,764,487 A | * | 6/1998 | Natsume .................... 361/775 |
| 5,875,091 A | * | 2/1999 | Rieken ....................... 361/328 |
| 6,109,927 A | * | 8/2000 | Scholz et al. ................. 439/65 |
| 6,194,656 B1 | * | 2/2001 | Kondo et al. ............... 174/52.1 |

FOREIGN PATENT DOCUMENTS

| EP | 0857617 | 8/1998 |
|---|---|---|
| EP | 0887884 | 12/1998 |
| JP | 07241020 | 9/1995 |

OTHER PUBLICATIONS

English language abstract of JP NO. 07 241020 A—No date.

* cited by examiner

Primary Examiner—Brian Sircus
Assistant Examiner—Thanh-Tam Le
(74) Attorney, Agent, or Firm—Greenblum & Bernstein, P.L.C.

(57) ABSTRACT

There is provided an electrical connector housing including a printed circuit board, which is designed to avoid the formation of unusable space. The electrical connector housing which contains such a printed circuit board includes conductor patterns, bus bar circuitry including a plurality of bus bars, and an electronic component including a plurality of lead terminals. Further, the printed circuit board and the bus bar circuitry are arranged side by side on a same plane. Some of the plurality of lead terminals are electrically connected to the conductor patterns, while the other lead terminals are electrically connected to the bus bars.

4 Claims, 2 Drawing Sheets

ELECTRICAL CONNECTOR HOUSING

CROSS-REFERENCE TO RELATED APPLICATIONS

Not Applicable

STATEMENT REGARDING FEDERALLY SPONSORED RESEARCH

Not Applicable

REFERENCE TO A MICROFICHE APPENDIX

Not Applicable

BACKGROUND OF THE INVENTION

1. Description of Background Information

Electrical connector housings are traditionally used for connecting or branching wire harnesses to electrical equipment in automobiles. Such an electrical connector housing is disclosed, e.g. in a Japanese Patent Application published under the number HEI 7-241020.

In this example, the electrical connector housing includes an upper-half shell and a lower-half shell which, when closed, define an inner space. In the inner space, there are commonly provided a printed circuit board, a bus bar circuit and an electronic component. The electronic component is mounted on one face of the printed circuit board. The electronic component may include a plurality of lead terminals. These lead terminals are led into through-holes provided in the printed circuit board, and project from the other face (back face) of the printed circuit board. These lead terminals include short-sized terminals which may be electrically connected to the conductor patterns formed on the printed circuit board. The back face of the printed circuit board is mounted with a bus bar circuit consisting of a plurality of bus bars, the bus bar circuit being arranged in laminations. The lead terminals also include longer-sized terminals which may be electrically connected to the bus bars.

When an electronic component requires a high level of electric current, as is the case with a relay, its size tends to become large as a function of the electric current level. Moreover, a lead terminal connecting the electronic component to a power supply source is usually made wide so as to lower resistance. As a result, the printed circuit board must be provided with a correspondingly large through-hole, commensurate with the lead terminal, for connection with the electrical power source. The printed circuit board thus tends to yield unusable space. For instance, such a structure may reduce the areas for mounting other unitary parts or equipment, and leave less room for wiring. Moreover, the large-size electronic component itself covers a large portion of the surface of printed circuit board, and thus takes away a considerable part of the usable space. As a matter of fact, the above-described kind of large-size printed circuit board is still used in the prior art technology. As a consequence, an electrical connector housing containing such a printed circuit board has a cumbersome structure.

2. Field of the Invention

The present invention relates to an electrical connector housing containing at least one printed circuit board, at least one bus bar circuit and at least one electronic component.

BRIEF SUMMARY OF THE INVENTION

In view of the above, an object of the present invention is to provide an electrical connector housing which is less prone to take up usable space on the printed circuit board.

To this end, there is provided an electrical connector housing containing at least one printed circuit board including at least one conductor pattern, bus bar circuitry including at least one bus bar, and at least one electronic component including a main component unit and a plurality of lead terminals extending therefrom. The printed circuit board and the bus bar circuitry are arranged side by side on a plane, and at least one of the plurality of lead terminals is electrically connected to the at least one conductor pattern, while at least one of the plurality of lead terminals is electrically connected to the at least one bus bar.

Typically, the at least one electronic component may comprise a power component including a main component unit and a plurality of lead terminals extending therefrom. The plurality of lead terminals include at least one lead terminal having a wide gauge and being adapted to connect to an electrical supply source. The power component is then arranged on a plane other than the plane on which the printed circuit board and the bus bar circuitry are placed. Further, the printed circuit board is defined by an outer side-rim. The whole structure is configured such that a major portion of the main component unit of the power component extends sideways from the outer side-rim of the printed circuit board Advantageously, the at least one of the plurality of lead terminals is bonded directly to the at least one conductor pattern and the at least one bus bar by soldering.

According to a first embodiment of the invention, bus bar circuitry including a plurality of bus bars is arranged side by side with a printed circuit board on the same plane therewith. Accordingly, even if an electronic component including wide-sized lead terminals is employed, these lead terminals can be connected to the bus bars without passing through through-holes. It is therefore no longer necessary to specifically perforate wide-gauged through-holes in the printed circuit board so as to enable the wide-sized lead terminals to pass therethrough. As a result, the printed circuit board is able to reserve more usable space. This thereby avoids reducing areas that can be used for other equipment, and secures room for free-wiring operations.

According to a second embodiment of the invention, an electronic component used is typically a power component. A major portion of the power component is then mounted sideways, extending from the outer rim of the printed circuit board. In this manner, the power component no longer covers a large surface of the printed circuit board, so that the unusable space of the latter is reduced.

According to a third embodiment of the invention, each of the lead terminals is directly bonded to a corresponding conductor pattern or bus bar by soldering. This type of connection process obviates the need for relay terminals normally required for electrical connections. The bonding process thus reduces the number of unitary parts used, and simplifies the structure of the electrical connector housing.

BRIEF DESCRIPTION OF THE DRAWINGS

The above and the other objects, features and advantages of the invention shall become more apparent from the following description of the preferred embodiments, given as non-limiting examples, with reference to the accompanying drawings in which.

DESCRIPTION OF THE PREFERRED EMBODIMENTS

The electrical connector housing 1 of the present invention belongs to a group of devices referred to as junction boxes (J/B).

Figure 1:
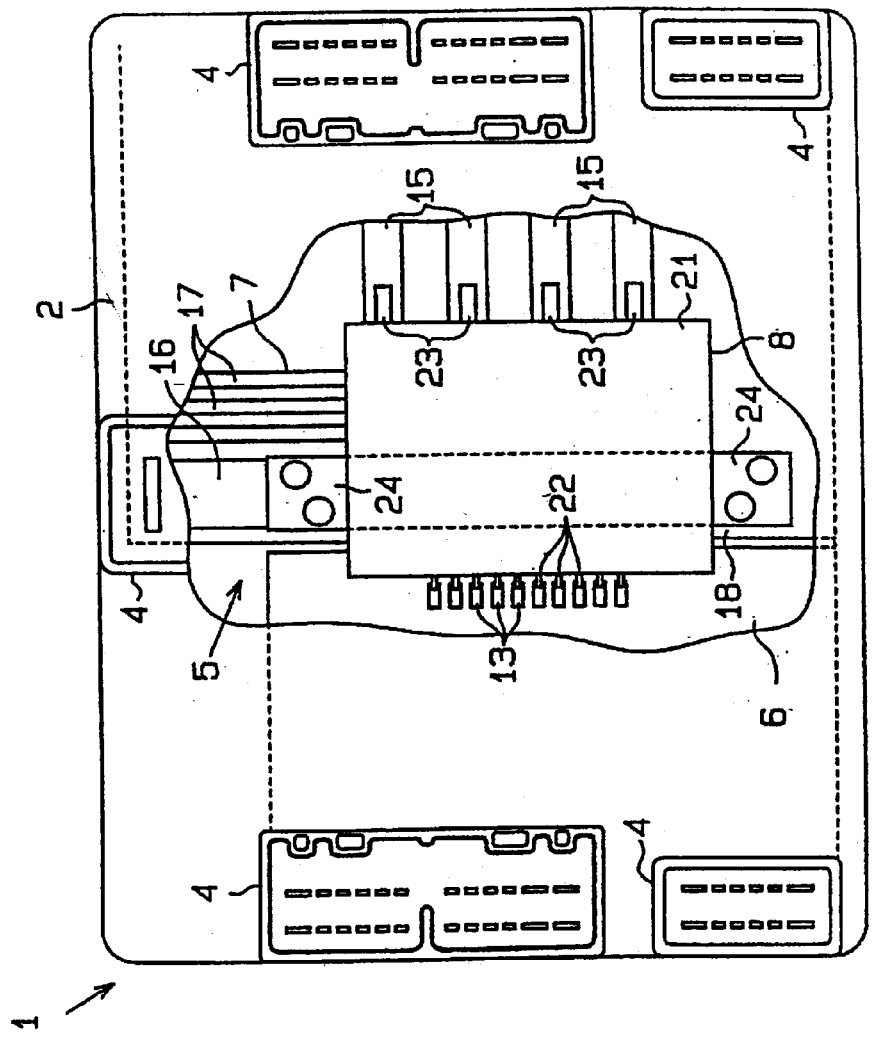
FIG. 1 is a top plan view, partially exploded, of an electrical connector housing according to an embodiment of the invention.

As shown in FIG. 1, the electrical connector housing 1 includes an upper-half shell 2 and a lower-half shell 3, both made of a synthetic resin. The upper-half shell 2 has a top face, from which project a plurality of connector-fitting portions 4. Connectors (not shown in the figures) mate with these connector-fitting portions in a freely removable way. Conversely, the lower-half shell 3 has an upwardly open face. The above-mentioned upper-half shell 2 fits onto the upwardly open face. The upper- and the lower-half shells 2 and 3 are mutually fixed by a locking means not shown in the figures. When fixed, both shells 2 and 3 form an inner space 5 that can contains different kinds of unitary parts.

Figure 2:
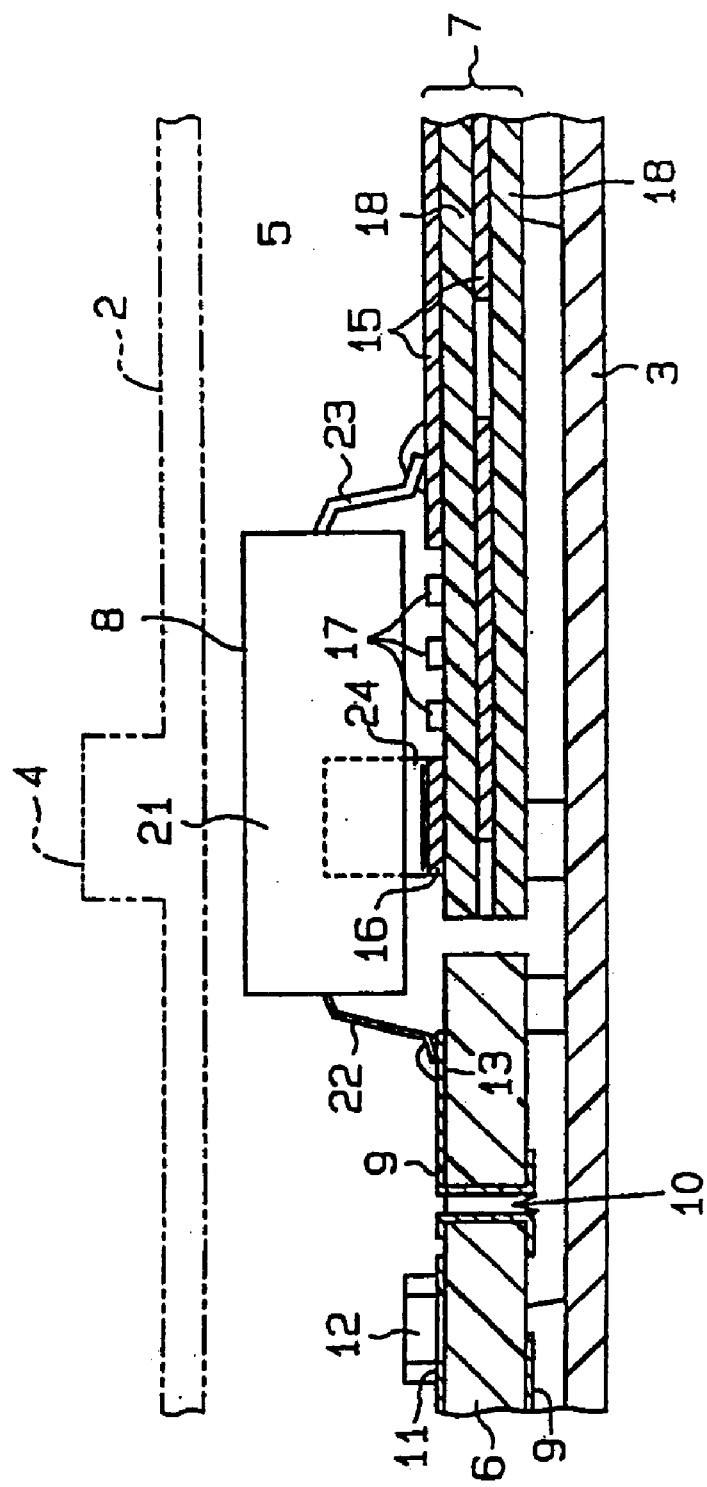
FIG. 2 is a cross-sectional side view of the electrical connector housing of FIG. 1.

The inner space 5 contains a printed circuit board 6, bus bar circuitry 7 and an electronic component 12 such as a power component 8 shown in FIGS. 1 and 2. Therefore, the electrical connector housing 1 has a hybrid structure incorporating a printed circuit board and bus bar circuitry 7.

The printed circuit board 6 of the present invention comprises an insulating base plate, and a front and rear face conductor portion flanking the insulating base plate, thereby forming what is known as a "double-sided board". Such a printed circuit board 6 may have a substantially rectangular shape, and cover a horizontal surface amounting to nearly half the electrical connector housing 1, when viewed from the top. The printed circuit board 6 is fixed on the inner bottom face of the lower-half shell 3. The board 6 is further provided with conductor patterns 9 and through-holes 10 that are located at respective predetermined positions. Further, a portion on some of the conductor patterns 9 is provided with a first pad 11 for establishing an electrode connection. The first pad 11 is mounted with an electrode of relatively small electronic component 12 such as an impedance chip or a condenser chip. Both the first pad 11 and the electronic component 12 are then soldered together on the surface of the first pad 11. Likewise, a portion of some other conductor patterns 9 is provided with a second pad 13 for establishing lead terminal connections. Such second pads 13 are arranged in an array at a same interval along the outer rim of the printed circuit board 6.

The bus bar circuitry 7 of the present embodiment comprises one or a plurality of groups of bus bars which may have different widths 15, 16 and 17, respectively. The circuitry 7 further comprises one or a plurality of insulating base sheets 18. The groups of bus bars 15, 16 and 17 are mounted on a respective insulating base sheet 18, and the resulting unit layers may be stacked to form a multi-layer structure. The insulating base sheets 18 serve to insulate the unit layers from each other. The insulating base sheets 18 constituting the bus bar circuitry 7 cover a surface exceeding half the electrical connector housing 1, when viewed from the top. The insulating base sheets 18 are fixed onto the inner bottom surface of the lower-half shell 3. The end portion of the groups of bus bars 15, 16 and 17 is bent at a right angle to form a tab j(not shown). These tabs are passed through tab holes formed in the base of the connector-fitting portion 4, and extend outwardly from the upper-half shell 2. As shown in FIGS. 1 and 2, the printed circuit board 6 and the bus bar circuitry 7 are arranged on the same plane (i.e. on the inner bottom surface of the lower-half shell 3) side by side, without overlapping each other.

The power component 8 used as an electronic component 12 comprises a main component unit 21 which may be rectangular. It also comprises a first group of lead terminals 22, a second group of lead terminals 23 and a third group of lead terminals 24, respectively extending sideways from the power component 8. The main component unit 21 provides functions equivalent to several relays commonly used.

The first group of lead terminals 22 including e.g. ten lead terminals, extend from a side face of the main component unit 21. The first group of lead terminals 22 are designed to connect to pads 13 having a small surface, so that they are narrow and are arranged at a small pitch. The second group of lead terminals 23 including e.g. four lead terminals, extend from the other side face of the main component unit 21, distal to that from which extend the first group of lead terminals 22. The second group of lead terminals 23 are designed to be connected to the group of bus bars 15 having a median width, so that they have a larger width and are arranged at a larger pitch, compared with the first group of lead terminals 22. By contrast, the power component 8 requires a larger current in order to be put into operation. Therefore, there is also provided a third group of lead terminals 24, in addition to the first and second groups of lead terminals 22 and 23. The third group of lead terminals 24 thus connect to an electrical supply source. In the present embodiments, the main component unit 21 is provided with two lead terminals extending therefrom for connection to the electrical supply source. The third group of lead terminals 24 (two lead terminals for electrical supply source) extend respectively from a side face of the main component unit 21 perpendicular to those from which extend the first and the second groups of lead terminals 22 and 23.

As shown in FIGS. 1 and 2, the first group of lead terminals 22 are directly bonded to the pads 13 by soldering, whereas the second group of lead terminals 23 are directly bonded to the median-width bus bars 15 by soldering. Likewise, the third group of lead terminals 24 connecting to the electrical supply source are directly bonded to the largest-width bus bars 16 by soldering. As can be seen, the groups of lead terminals 22, 23 and 24 are directly bonded to the corresponding pads 13 and bus bars 15 and 16, without making use of any intermediate terminal.

In such a construction, a major portion of the main component unit 21 of the printed circuit board 6 projects sideways away from the outer rim of the printed circuit board 6, i.e. towards the bus bar circuitry 7. In other words, the power component 8 is mounted so as to bridge over the printed circuit board 6 and the bus bar circuitry 7.

As a result, the present embodiments introduces the following effects.

In the electrical connector housing 1, a printed circuit board 6 and bus bar circuitry 7 are arranged side by side on the same plane. Further, a group of narrow-width lead terminals 22 are bonded to a group of pads 13 by soldering, whereas a group of median-width lead terminals 23 are bonded to a group of bus bars 15 by soldering. Likewise, a group of wide-gauge lead terminals 24, provided for connection to electrical supply sources, are bonded to another group of bus bars 16 by soldering. When the electrical connector housing 1 is thus configured, there is no need to provide through-holes for lead terminals in the printed circuit board 6. Nonetheless, the wide-gauged lead terminals 24 for the electrical sup sources can be connected to the bus bars 16 without any inconvenience. As large through-holes are no longer required, the printed circuit board 6 wastes no space for these through-holes. Accordingly, such a space can be kept available for mounting other electronic components 12. This configuration also enables construction of a high density structure. Likewise, a larger space is available for wiring the conductor patterns 10, giving greater freedom for the wiring operation. Moreover, even if a printed circuit board 6 used is not sufficiently large, the required patterns may be laid out on the latter without any difficulty.

In the electrical connector housing 1, a major portion of the main component unit 21 of power component 8 extends sideways from the outer rim of the printed circuit board 6. Accordingly, the power component 8 does not cover a large surface on the printed circuit board 6, so that it does not take away space that can be reserved for other electronic components 12. As a result, though the main component unit 21 of the power component 8 is considerably large, the printed circuit board 6 nevertheless does not lose much space.

In the electrical connector housing 1, each lead terminal 22, 23 or 24 is directly bonded to a corresponding pad 13, or bus bar 15 or 16 by soldering. This obviates the need for intermediate connection terminals. The number of necessary parts used is then reduced, and the structure can be simplified. Costs are thus reduced, and the housing can be miniaturized.

Further, the present invention is not limited to the above-mentioned embodiments. For example, a power component 8 having functions differing from those mentioned above may be used as an electronic component 12. Likewise, components other than power components 8 may be used as electronic components 12, and bonded to pads 13 or bus bars 15 or 16.

Further yet, the main component unit 21 of the power component 8 may be provided completely outside the outer rim of the printed circuit board 6. Conversely, when the power component 8 is not of such a large size as to hinder the installation of other electronic components 12, the main component unit 21 may be placed over the printed circuit board 6, barely projecting from the outer rim of the latter.

Moreover, the structure of the printed circuit board 6 is not limited to a "double-sided board". It may also be applicable to a "single-sided board" or a "multi-layered board".

Likewise, the plurality of lead terminals 22, 23 and 24 included in an electronic component 12 are not limited to the three types with different widths as described in the above embodiments. They may have two types of different width, or four or further types having different widths. Alternatively, a plurality of lead terminals may all have the same width. Further, all the connector terminals contained in the electronic component 12 may not necessarily be lead terminals, such as lead terminals 22, 23 and 24. For example, some of the connector terminals may be simple flat electrodes.

When electrically connecting pads 13 or bus bars 15 or 16 to lead terminals 22, 23 or 24, soldering or welding is not the sole technique that can be used. Other equivalent means may also be applied for the same purpose.

Apart from the objects of the invention described in relation to the claims, other technical features., as understood from the embodiments supra, are given hereinafter, together with their effects.

The electronic component is mounted by bridging over the printed circuit board and the bus bar circuitry. Accordingly, the printed circuit board of the invention grants more available space, compared to the structure used in the construction of known printed circuit.

The first group of lead terminals bonding to the conductor patterns have a relatively narrow width and are arranged at a short pitch. By comparison, the second group of lead terminals bonding to the bus bars have a wider gauge and are arranged at a larger pitch.

The power component, supra, fulfills several functions equivalent to a plurality of relays. Accordingly, it may suffice to use a single power component for the whole structure of the electrical connector housing. As a result, the bus bars required for connecting between relays may be eliminated, and the configuration of the bus bar circuitry may be simplified.

The lead terminals supra are bonded to the conductor patterns and bus bars without using intermediate terminals. This therefore reduces the number of parts used, and the structure can thus be simplified. Consequently, the whole structure of electrical connector housing can be miniaturized.

As mentioned above, the electrical connector housing according to the first embodiment of the invention includes a printed circuit board which is designed to grant more available space compared to known printed circuit boards.

By virtue of the configuration adopted by the second embodiment of the invention, the available space can be kept intact even after a power component is mounted.

According to the third embodiment of the invention, the number of parts used is reduced, and the structure is thus simplified. The whole structure of the electrical connector housing can thug be miniaturized.

Although the invention has been described with reference to particular means, materials and embodiments, it is to be understood that the invention is not limited to the particulars disclosed and extends to all equivalents within the scope of the claims.

The present disclosure relates to subject matter contained in priority Japanese Patent Application No. HEI 11-075245, filed on Mar. 19, 1999, which is herein expressly incorporated by reference in its entirety.

DEPOSIT OF COMPUTER PROGRAM LISTINGS

Not applicable

What is claimed is:

1. An electrical connector housing comprising:

at least one printed circuit board including at least one conductor pattern;

bus bar circuitry including at least one preformed metal bus bar, said bus bar circuitry being formed separately from said printed circuit board;

at least one electronic component including a main component unit and a plurality of lead terminals extending therefrom, said printed circuit board and said bus bar circuitry being arranged side by side; and at least one of said plurality of lead terminals being electrically connected to said at least one conductor pattern, and at least one of said plurality of lead terminals being electrically connected to said at least one bus bar.

2. The electrical connector housing according to claim 1, wherein said at least one electronic component comprises a power component including said main component unit having said plurality of lead terminals extending therefrom, said plurality of lead terminals including at least one lead terminal having a wider gauge than others of said plurality of lead terminals, and configured to connect to an electrical supply source, and wherein said power component overlies said printed circuit board and said bus bar circuitry, said printed circuit board being defined by an outer side-rim, such that a major portion of said main component unit of said power component extends sideways from said outer side-rim of said printed circuit board.

3. The electrical connector housing according to claim 1, wherein said at least one of said plurality of lead terminals is bonded directly to said at least one conductor pattern and said at least one bus bar by soldering.

4. The electrical connector housing according to claim 2, wherein said at least one of said plurality of lead terminals is bonded directly to said at least one conductor pattern and said at least one bus bar by soldering.

* * * * *